United States Patent [19]

Dahlberg

[11] 4,451,843

[45] May 29, 1984

[54] BIPOLAR TRANSISTOR WITH A PLURALITY OF PARALLELLY CONNECTED BASE-COLLECTOR JUNCTIONS FORMED BY PLASTIC DEFORMATION OF THE CRYSTAL LATTICE

[75] Inventor: Reinhard Dahlberg, Flein, Fed. Rep. of Germany

[73] Assignee: Higratherm Electric GmbH, Heilbronn, Fed. Rep. of Germany

[21] Appl. No.: 164,560

[22] Filed: Jun. 30, 1980

[30] Foreign Application Priority Data

Jul. 3, 1979 [DE] Fed. Rep. of Germany ....... 2926785

[51] Int. Cl.³ .............................................. H01L 29/72
[52] U.S. Cl. .......................................... 357/36; 357/9; 357/20; 357/55
[58] Field of Search ........................ 357/35, 36, 34, 79, 357/76, 55, 20, 68, 65, 9

[56] References Cited

U.S. PATENT DOCUMENTS

| | | | |
|---|---|---|---|
| 2,597,028 | 5/1952 | Pfann | 357/36 |
| 2,618,690 | 11/1952 | Stuetzer | 357/6 |
| 2,641,638 | 6/1953 | Pantchechnikoff | 357/36 |
| 2,663,830 | 12/1953 | Oliver | 357/46 |
| 2,717,342 | 9/1955 | Pfann | 357/36 |
| 2,728,034 | 12/1955 | Kurshan | 357/6 |
| 2,911,539 | 11/1959 | Tanenbaum | 357/55 |
| 2,929,006 | 3/1960 | Herlet | 357/36 |
| 3,166,448 | 1/1965 | Hubner | 357/36 |
| 3,429,029 | 2/1969 | Langdon et al. | |
| 3,525,910 | 8/1970 | Philips | 357/79 |
| 3,657,611 | 4/1972 | Yoneda | |
| 3,893,160 | 7/1975 | Botzenhardt | |
| 4,081,825 | 3/1978 | Koopman et al. | 357/79 |
| 4,127,863 | 11/1978 | Kurata | 357/79 |

FOREIGN PATENT DOCUMENTS

| | | |
|---|---|---|
| 1283970 | 11/1968 | Fed. Rep. of Germany . |
| 1489017 | 9/1970 | Fed. Rep. of Germany . |
| 2041497 | 3/1971 | Fed. Rep. of Germany . |
| 2244062 | 3/1974 | Fed. Rep. of Germany . |

OTHER PUBLICATIONS

Obernik, "Vom Spitzentransistor zum Hetero-Übergangs-Laminartransistor", Radio Fernsehen Elektronik, (1968), pp. 248–251.

Schäfer, Herstellung Von p-n-Übergangen Durch Gemeinsame Plastische Verforung Von p- Und n- Dotiertem Germanium, Solid-State Electronics, vol. 11, 1968, pp. 675–681.

Primary Examiner—William D. Larkins
Attorney, Agent, or Firm—Spencer & Frank

[57] ABSTRACT

A bipolar transistor comprises a pair of monocrystalline semiconductor discs, plates or chips, one n-doped and one p-doped, one of the discs, plates or chips providing the base region and having an oppositely doped emitter region and a base/emitter p-n junction, and both of the discs, plates or chips having a structure of parallel ridges which face, cross and touch when the discs plates or chips are assembled together under mechanical pressure, the surfaces of the side edges of the ridges on the other of the discs being highly doped with the conductivity type of the base region whereby the contact surfaces between the ridges form parallel connected base/collector p-n junctions as a result of plastic deformation of the semiconductor material. The invention also includes a method of making such a bipolar transistor.

15 Claims, 4 Drawing Figures

BIPOLAR TRANSISTOR WITH A PLURALITY OF PARALLELLY CONNECTED BASE-COLLECTOR JUNCTIONS FORMED BY PLASTIC DEFORMATION OF THE CRYSTAL LATTICE

BACKGROUND OF THE INVENTION

The invention relates to a bipolar transistor in which the base/collector junction is produced by means of slight plastic deformation of a semiconductor lattice.

Bipolar transistors are manufactured chiefly in planar structure or in mesa structure today, and silicon has been used predominantly as the material for this. Both the emitter/base junction and the base/collector junction are produced mainly by diffusion. Less frequently, the technique of ion inplantation and epitaxy is used to produce one of these p/n junctions.

It is known from the publication "Manufacture of p-n junctions by means of joint plastic deformation of p-doped and n-doped germanium" by S. Schäfer, SOLID-STATE ELECTRONICS, vol. 11, pages 675–681 (1968) to produce p/n junctions by means of which n- and p-semicomductor monocrystals comprising silicon or germanium are jointly deformed under pressure at a fairly high temperature. As long as the degree of deformation is not greater than 3% (dislocation density less than $10^6/cm^2$) then p/n junctions may be produced with good electrical properties by this method.

SUMMARY OF THE INVENTION

It is an object of the invention to produce a transistor in which the base/collector junction is produced by means of plastic deformation, which transistor has cost advantages in manufacture chiefly for large power and high frequencies.

According to a first aspect of the invention, there is provided a bipolar transistor comprising a first and a second monocrystalline semiconductor plate, disc or chip of the same conductivity type, an opposite conductivity type base region provided on one surface of and forming an emitter/base p-n junction with said first plate, disc or chip, a structure comprising parallel ridges on both plates, discs or chips which ridges face, cross and touch when said plates, discs or chips are assembled together under mechanical pressure, and a highly doped surface layer of the same conductivity as said base region on the side surfaces of said ridges of said second plate, disc or chip, the contact surfaces between the ridges of said plates, discs or chips forming parallel connected base/collector p-n junctions as a result of plastic deformation of the semiconductor material.

Further according to this aspect of the invention, there is provided a bipolar transistor having a p/n junction produced by means of plastic deformation, in which in a p-doped and an n-doped monocrystalline semiconductor plate, disc or chip are provided; both semiconductor plates, discs or chips have a structure comprising parallel ridges on one face; one semiconductor disc contains an opposite conductivity type emitter region on its opposite surface which forms an emiter-base p/n junction; the side surfaces of the ridges in the other semiconductor plate, disc or chip have a highly doped surface layer with the type of conductivity of the base region; both semiconductor discs are assembled by mechanical pressure so that the ridges of the structured faces of both plates, discs or chips cross and touch; and that the surfaces in contact form electrically parallel base-collector p/n junctions of equal area as a result of plastic deformation of the semiconductor lattice.

According to a second aspect of the invention, there is provided a method of producing a bipolar transistor comprising producing a p-doped monocrystalline semiconductor plate, disc or chip and an n-doped monocrystalline semiconductor plate, disc or chip, with structures of parallel ridges on one main face of said semiconductor plates, discs or chips and with one said plate, disc or chip forming a base region and having an oppositely doped emitter region, which forms an emitter/base p-n junction, on the opposite main face, and the other said plate, disc or chip having the side surfaces of its said ridges provided with a highly doped layer with the same conductivity type as said base region, assembling said two plates discs or chips together under mechanical pressure while orientated so that the ridges on the plates, discs or chips cross and touch to form electrically parallel base-collector p-n junctions by plastic deformation of the semiconductor material at the contact regions between said plates, discs or chips.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1A:
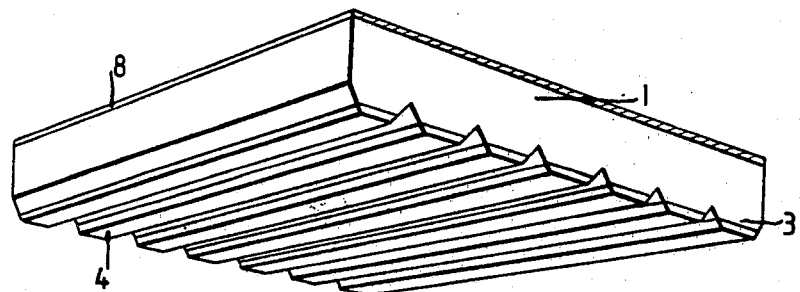
FIG. 1a is a perspective view of two plates used to form a bipolar transistor in accordance with a first embodiment of the invention.
Figure 1A:
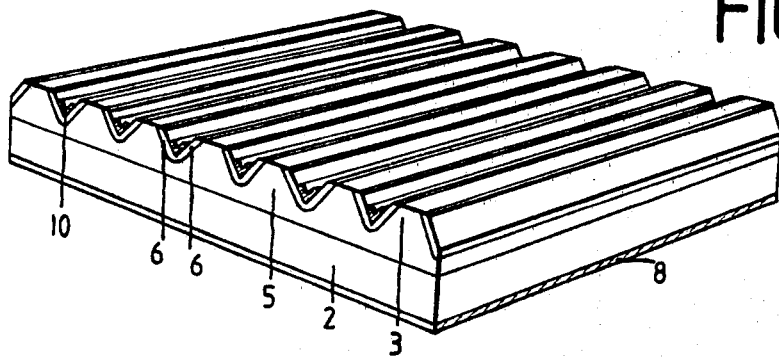

Basically the invention proposes that a p-doped and an n-doped monocrystalline semiconductor plate, disc or chip are provided; that both semiconductor discs have a structure comprising parallel ridges on one surface; that one semiconductor plate, disc or chip contains the emitter and base regions and the emitter/base p/n junction, with the base region being at the structured surface; that the side surfaces of the ridges in the structure of the other semiconductor plate, disc or chip, which forms the collector zone, have a highly doped surface layer with the type of conductivity of the base region; that both semiconductor discs are assembled together under mechanical pressure so that the ridges of the structured surface of both discs cross and touch; and that the surfaces in contact form electrically parallel base-collector p-n junctions of equal area as a result of plastic deformation of the semiconductor lattice. The plastic deformation of the semiconductor lattice at the areas of contact of the crossing ridges is achieved under pressure and at increased temperature.

The principle of crossing, parallel ridges has already been described in German Offenlegungsschrift No. P 25 47 262. The refinement of this principle for bipolar transistors is not mentioned in German Offenlegungsschrift No. 25 47 262.

The structure having the ridges on the semiconductor discs may be produced with the air of a chemical, electrochemical or plasma etching technique in a manner known per se.

The protective layer of the mask for etching the structure on the two semiconductor discs may also be used as a mask in a subsequent diffusion, ion implantation or epitaxial process. The protective layer of the etching mask may also be used without any change for the subsequent application of a layer of metal. The part of the layer lying on the protective layer is rinsed away when chemically dissolving the protective layer.

The two semiconductor plates, discs or chips are provided with a non-blocking contact on their non-structured surfaces.

The two semiconductor plates discs or chips may have an epitaxial layer on their structured side and the structure having the ridges may be located within this epitaxial layer.

Metals, such as W, Mo, Pt, Pd, Cr, Ti and Ni (among others), are preferably used in order to metallize the highly doped layer, which has the conductivity characteristic of the base, on the side surfaces of the ridges.

Preferably, silicon, germanium and III/V compounds are used as the semiconductor material.

The transistor of the invention is prefereably suitable for high-frequency power applications.

Referring now to the drawings, two embodiments of the invention will be described hereafter Embodiment 1 is a pnp high-frequency power transistor.

Embodiment 2 is a power transistor.

Embodiment 1

Figure 1B:
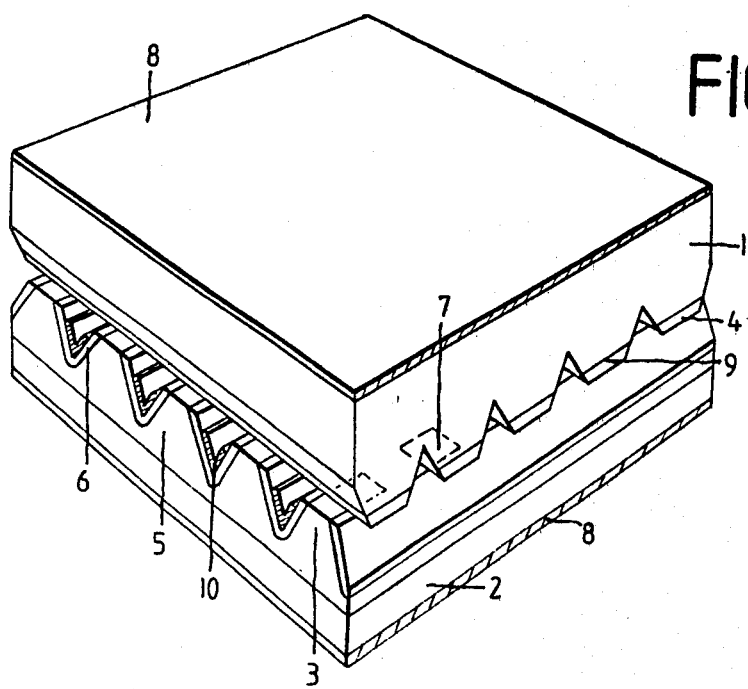
FIG. 1b is a perspective view of the completed transistor.
Figure 1C:
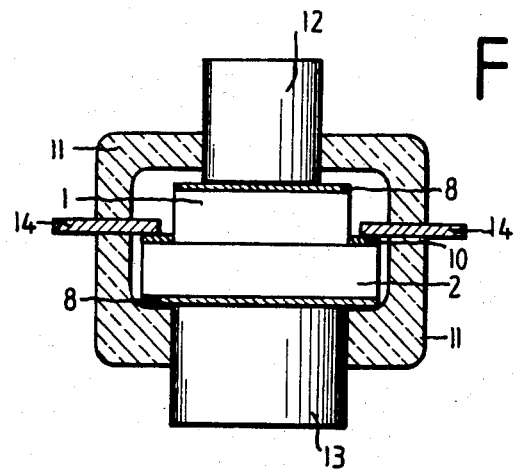
FIG. 1c is a sectional view of the transistor of FIG. 1b complete with contacts etc.
Figure 2:
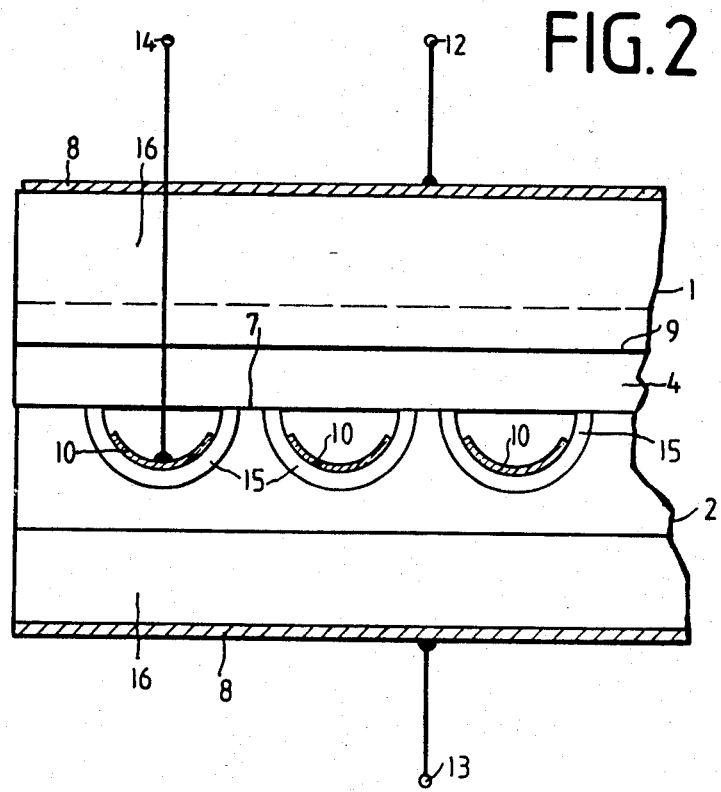
FIG. 2 is a sectional view of a second embodiment of the invention.

In FIG. 1a, 1 and 2 (oriented to 100) are monocrystalline p+ silicon chips. The semiconductor chip 1 has an n-epitaxial layer 4 on its surface provided for structuring, the layer 4 becoming the base region when the component is complete, while the semiconductor chip 2 has a p-epitaxial layer 5 also on the surface provided for structuring, the layer 5 becoming the collector region when the component is complete. A structure comprising parallel ridges 3 separated by grooves was formed into the surface of the two semiconductor chips 1 and 2.

The ridge structure with the ridges 3 is located in the semiconductor chip 2 within the epitaxial layer 5. An n+-layer 6, corresponding to the type of conductivity of the base region 4, is introduced into the side surfaces of the ridges 3, which taper towards a width at the end face of $2.5 \cdot 10^{-4}$ cm, with the layer 6 being in contact with a layer of metal 10 in the respective grooves between the ridges.

An etching mask required to produce the ridges 3 may be used both as a mask for the n+-diffusion of layer 6 and for the structured application of the metal layer 10. This mask, which may be used several times, comprises $SiO_2$ strips covering the outer faces of the ridges 3, for example.

The two chips 1 and 2 are assembled under mechanical press pressure as shown in FIG. 1b. They are rotated in the plane of the chips so that the ridges of one chip are at 90° with respect to the ridge structures on the other chip. Thus the ridges of both discs cross and are in contact. The areas of contact are transformed into monocrystalline base-collector pn junctions 7 by means of a temperature process in a hydrogen atmosphere at 850° C. The n+-layers 6 thus become connection contacts for the base region 4. Metal layers 8, which are non-blocking metal contacts, are located at the surfaces of the p+-chips 1 and 2 opposite the ridge structures. The transistor arrangement is, as shown in the sectional view of FIG. 1c, inserted into a coaxial ceramics casing 11 in which 12 is the emitter connection, 13 is the collector connection and 14 is the base connection. Since the spacing between the ridges 3 is $1.10^{-3}$ cm and the ridges 3 taper to a width of $2.5 \cdot 10^{-4}$ cm at their end face, and with the depth of the n+-layer 6 being approximately $5 \cdot 10^{-5}$ cm and the active area of the transistor being approximately 1 cm², the transistor arrangement contains approximately $10^6$ electrically parallel individual pnp structures having an area of approximately $1.5 \times 1.5 \times .10^{-8}$ cm² each. The arrangement according to FIG. 1 is particularly suitable as a high-frequency power transistor.

Embodiment 2

In the sectional view of FIG. 2, 1 is an n-doped monocrystalline silicon chip into which the p+-diffusion region 16 was diffused on one side. The base region of the transistor arrangement is formed by the remaining n-conductive layer 4. A p-conductive monocrystalline silicon chip 2 has a p+-layer 16 also diffused into it. The remaining p-layer of chip 2 is the collector region of the transistor arrangement. A structure of parallel ridges 3 has been formed into both silicon chips on their side which is of higher resistance, the structure penetrating through the base region 4 into the p+-region 16 on the semiconductor disc 1, while this structure does not penetrate the p/p+-junction on the disc 2 and only penetrates the p-conductive material. p+-doped layers 15 have been diffused into the side surfaces of the ridges 3 on the disc 2, and the metallic layer 10 was applied to these layers 15 as a non-rectifying contact. The surfaces of the crossing; ridges of the two discs which are in contact are transformed into base/collector p/n junctions 7. 9 is the emitter/base p/n junction in the chip 1. 8 are non-blocking contacts at the p+-diffusion regions 16 on the surfaces opposite the ridge structures, the emitter connection 12 or the collector connection 13 being arranged on these surfaces. The base connection 14 is arranged on the layer 10 of metal. This transistor arrangement is suitable for general applications in electronics with ridge spacings of the order of magnitude of $10^{-2}$ cm and the base/collector p/n areas of less than $10^{-6}$ cm² for npn and pnp power transistors. They may be constructed so that they are suitable for dealing with small to very large output losses.

It will be understood that the above description of the present invention is susceptible to various modification changes and adaptions.

What is claimed is:

1. A bipolar transistor having a collector-base p/n junction produced by means of plastic deformation comprising: a p-doped and an n-doped monocrystalline semiconductor plate, disc or chip; both semiconductor plates, discs or chips have a structure comprising parallel ridges on one main face; one semiconductor disc forms a base region and contains an opposite conductivity type emitter region on its opposite main face so as to form an emitter-base p/n junction; the side surfaces of the ridges in the other semiconductor plate, disc or chip have a highly doped surface layer with the type of conductivity of the base region; both semiconductor discs are assembled, by mechanical pressure, so that the ridges of the structured faces of both plates, discs or chips cross and touch; and the surfaces of said ridges which are in contact are connected together and form electrically parallel base-collector p/n junctions of equal area as a result of plastic deformation of the semiconductor lattice.

2. A bipolar transistor as defined in claim 1, wherein said ridges taper towards the free outer surface.

3. A bipolar transistor as defined in claim 1, and comprising an ohmic contact for each of said two semiconductor plates, discs or chips on the main face the opposite the respective said one main face.

4. A bipolar transistor as defined in claim 1, and comprising a metallization on the highly doped surface layer on the side surfaces of said ridges.

5. A bipolar transistor as defined in claim 4, wherein the metal used for the purpose of said metallization is selected from the group consisting of tungsten, tantalum, molybdenum, platinum, palladium, chromium and titanium.

6. A bipolar transistor as defined in claim 1, and comprising a material selected from the group consisting of silicon, germanium or III/V-compounds as the material for said semiconductor plates, discs or chips.

7. A bipolar transistor as defined in claim 1 wherein the grooves between said ridges on said one surface of said one semiconductor disc extend through said emitter-base p/n junction.

8. A bipolar transistor as defined in claim 1 wherein said highly doped surface layer extends to the free outer surface of said ridges whereby said surface layer contacts said ridges on said one of said discs, and hence the base region of the transistor.

9. A bipolar transistor as defined in claim 1 wherein said parallel ridges on said one disc intersect said parallel ridges on said other disc at an angle of 90°.

10. A bipolar transistor comprising first and second monocrystalline discs of one conductivity type and including the emitter zone and the collector zone, respectively; said first semiconductor disc having an opposite conductivity type base zone layer on one major surface with said layer forming a base-emiter p/n junction within said emitter zone within said first semiconductor disc; an arrangement of parallel extending grooves formed in said one major surface of said first disc and in one major surface of said second disc, and defining parallel extending ridges therebetween; a highly doped surface layer of the conductivity type of said base zone on the side surfaces of said ridges on said second semiconductor disc; said first and second semiconductor discs are arranged such that said ridges on one of said discs intersect said ridges on the other of said discs and contact one another at said major surfaces of said discs; and said first and second discs are connected together at the points of contact of said ridges due to plastic deformation of the semiconductor lattice and form parallel connected base-collector p/n junctions of equal surface area.

11. A bipolar transistor as defined in claim 10 wherein said grooves extend through said emitter-base p/n junction.

12. A bipolar transistor as defined in claim 10 further comprising a respective ohmic metal contact on the opposite major surface of each of said semiconductor discs, and an ohmic metal contact on said highly doped surface layer and within said grooves of said second semiconductor disc.

13. A bipolar transistor as defined in claim 12 wherein said ridges taper toward the respective said one major surface of said discs.

14. A bipolar transistor as defined in claim 10 wherein: said base zone layer is an epitaxial layer; an epitaxial layer is provided on said one major surface of said second semiconductor disc and said ridges are located, at least on one said semiconductor disc within the respective said epitaxial layer.

15. A bipolar transistor as defined in claim 14, wherein said transistor comprises a high frequency bipolar transistor.

* * * * *